United States Patent [19]

Dietze et al.

[11] 3,834,349

[45] Sept. 10, 1974

[54] DEVICE FOR HOLDING SEMICONDUCTOR DISCS DURING HIGH TEMPERATURE TREATMENT

[75] Inventors: Wolfgang Dietze; Reimer Emeis; Wolfgang Keller; Alfred Muehlbauer, all of Munich; Konrad Reuschel, Vaterstetten, all of Germany

[73] Assignee: Siemens Aktiengesellschaft, Berlin and Munich, Germany

[22] Filed: June 12, 1972

[21] Appl. No.: 261,945

[30] Foreign Application Priority Data

July 7, 1971 Germany............................ 2133877

[52] U.S. Cl..................... 118/500, 211/41, 269/296, 269/321 WE

[51] Int. Cl............................................. B05c 11/14

[58] Field of Search.... 269/287, 289, 296, 321 WE; 206/.8, .84; 211/41; 118/48, 49, 500

[56] References Cited

UNITED STATES PATENTS

| | | | |
|---|---|---|---|
| 2,010,734 | 8/1935 | Parker | 211/41 |
| 3,151,006 | 9/1964 | Grabmaier et al. | 118/48 X |
| 3,461,842 | 8/1949 | Conrad et al. | 211/41 |
| 3,480,151 | 11/1969 | Schmitt | 211/41 |

FOREIGN PATENTS OR APPLICATIONS

| | | | |
|---|---|---|---|
| 310,697 | 5/1929 | Great Britain | 211/41 |
| 110,293 | 4/1944 | Sweden | 211/41 |
| 566,489 | 1/1945 | Great Britain | 211/41 |

*Primary Examiner*—Al Lawrence Smith
*Assistant Examiner*—James G. Smith
*Attorney, Agent, or Firm*—Hill, Gross, Simpson, Van Santen, Steadman, Chiara & Simpson

[57] ABSTRACT

A device for holding semiconductor discs during high temperature treatment, such as the diffusion of impurities therein, consisting of a base plate having grooves extending therealong, and a plurality of spaced holders supported by the base plate, the holders having slots therein which are vertically aligned with the grooves in the base plate so that a semiconductor disc positioned with its edge in one of the grooves will be supported by the slots in the holder at a position at or above its center of gravity to prevent bending of the discs during high temperature treatment.

6 Claims, 2 Drawing Figures

DEVICE FOR HOLDING SEMICONDUCTOR DISCS DURING HIGH TEMPERATURE TREATMENT

BACKGROUND OF THE INVENTION

1. Field of the Invention

This invention is in the field of devices for supporting semiconductor discs along limited areas of contact during high temperature treatment and includes means for supporting the discs above their centers of gravity to prevent deformation of the discs during such high temperature treatment.

2. Description of the Prior Art

The diffusion treatment of semiconductor discs is carried out at relatively high temperatures. In the case of semiconductor discs consisting of silicon, the temperatures are normally in the range between 1100° and 1300°C. In this temperature range, the semiconductor discs are plastically deformable relatively easily. Such plastic deformation leads to dislocations in the crystal lattice which can have adverse effects on the electrical characteristics of the resulting semiconductor component.

Heretofore, semiconductor discs have been treated at high temperatures by standing them on end within grooves provided in a base plate. With such an arrangement, however, the weight of the discs alone can exert a bending moment on the discs during the high temperature treatment, so that disturbances and dislocations may occur in the crystal lattice.

SUMMARY OF THE INVENTION

The present invention provides a device for supporting semiconductor discs for high temperature treatment and includes a base plate of semiconductor material having grooves extending therealong, together with a holder composed of semiconductor material and supported by the base plate, the holder having slots therein vertically aligned with the grooves in the base plate. Each of the slots is proportioned to engage a semiconductor disc at least as high as its center of gravity when the disc is positioned standing on end in one of the grooves.

In the preferred embodiment of the invention, the holder consists of a cylindrical segment whose ends are received within positioning grooves located in the base plate.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENTS

Figure 1:
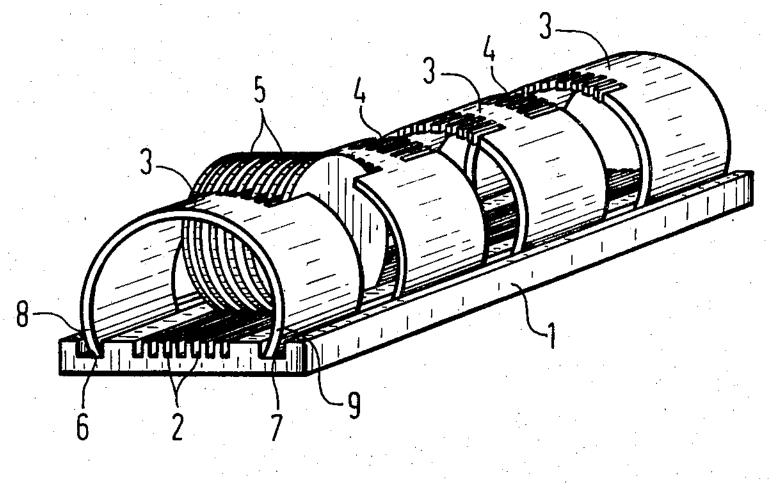
FIG. 1 is a view in perspective of a device according to the present invention.

In FIG. 1, reference numeral 1 has been applied to a base plate composed of a semiconductor material, the base plate 1 being provided with parallel grooves 2 extending the full length thereof parallel to the longitudinal axis of the base plate 1. A plurality of holders 3 are supported by the base plate 1, the holders having a generally inverted U-shaped configuration with opposed end portions 8 and 9 being positioned in longitudinally extending grooves 6 and 7 formed in the base plate 1 on opposite sides of and parallel to the grooves 2. The holders 3 have slots 4 formed therein, the slots in one holder being in horizontal alignment with corresponding slots in the next adjacent holder. These slots are in vertical alignment with one of the grooves 2 so that a plurality of semiconductor discs 5 may be held in the support by standing the discs 5 on end in the grooves 2 with the slots 4 embracing the discs at or above their centers of gravity. Accordingly, the doping material can diffuse without obstruction into the entire surface of the semiconductor disc.

The holder 3, the semiconductor discs 5 and the base plate 1 are all preferably composed of the same semiconductor material. The holders 3 can be produced from a tube of the semiconductor material by severing the tube along its longitudinal axis and then cutting the severed tube into individual segments. The slots may be produced, for example, by sawing the segments. The tubes used for the production of the holders 3 have a larger diameter than the diameter of the semiconductor discs 5 so that the semiconductor discs 5 can be supported above their center of gravity.

The tubular semiconductor material can be made by a variety of processes. A tube of silicon, for example, may be produced by flowing a gas mixture consisting of silicochloroform $SiHCl_3$ and hydrogen gas over a graphite rod which is heated to a temperature of about 1150° to 1200°C. The silicochloroform reacts with the hydrogen and deposits as crystalline silicon on the graphite forming member. Once a sufficient layer thickness has been built up, the graphite and the silicon layer are cooled. Since the graphite shrinks more than the silicon due to its higher thermal coefficient of expansion, the graphite member can be easily removed from the silicon tube. Tubes made of crystalline germanium can be produced in a similar manner, as by means of reacting germanium tetrachloride and hydrogen gas.

The holders may be made of other semiconductor materials such as silicon carbide, tungsten carbide and Group 3-Group 5 compounds as well as Group 2-Group 6 compounds. If the holder is to be produced from silicon carbide, trichlormethylsilane can be reacted with hydrogen to deposit silicon carbide on the graphite tube. For holders composed of boron nitride, compounds such as hexachlor borazole $B_3N_3Cl_6$ and hydrogen gas are used.

By making the base plate and the holders from the same semiconductor material as the discs, materials of high purity can be employed. Accordingly, the base plate and the holders do not form sources of imperfections which can be diffused into the semiconductor discs.

Figure 2:
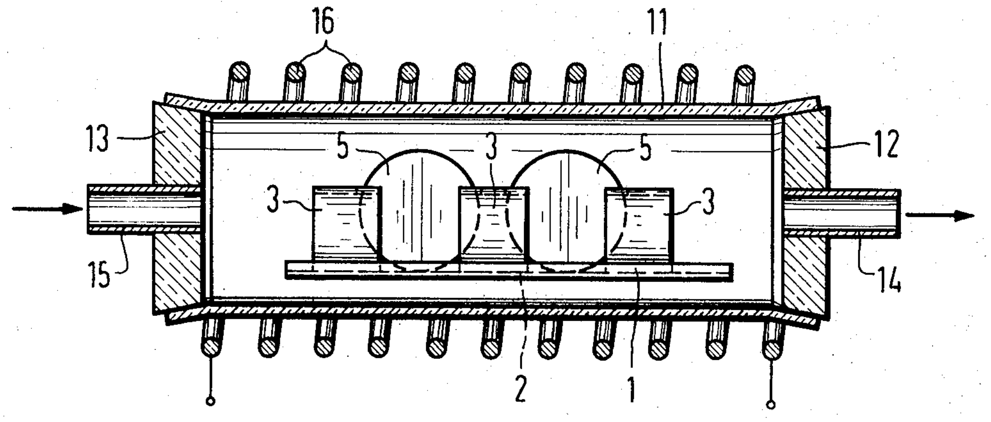
FIG. 2 is a cross-sectional view of a furnace assembly for diffusing impurities into semiconductor discs utilizing the device of the present invention.

In FIG. 2, we have illustrated schematically a diffusiontype furnace for diffusing impurities into the semiconductor discs while they are supported in the improved holder of the present invention. The diffusion oven consists of a tube 11 which is closed by means of plugs 12 and 13. Preferably, the tube 11 and the plugs 12 and 13 consist of the same semiconductor material as the semiconductor discs in the other parts. The plug 13 is provided with an inlet 16 through which the doping material is introduced in a gaseous state, together with a carrier gas such as nitrogen into the interior of the tube 11. The plug 12 is provided with an outlet 14 through which the residual gas escapes in the direction of the arrow. The tube 11 is provided with a heating element 16 which heats the tube to the diffusion temperature by radiated heat. The heating element 16 can be inductively heated with high frequency current if the tube 11 consists of semiconductor material.

The holding device of the present invention thus provides a convenient device for supporting semiconductor discs during high temperature treatment without danger of causing buckling. The parts of the holder are relatively inexpensive, easy to assemble, and easy to exchange.

It should be evident that various modifications can be made to the described embodiments without departing from the scope of the present invention.

We claim as our invention:

1. A device for supporting semiconductor discs for high temperature treatment comprising a base plate of semiconductor material having grooves extending therealong, a holder consisting of a tubular segment of semiconductor material, said base plate having a pair of grooves on opposite sides of and parallel to the aforementioned grooves receiving the ends of said holder therein, said holder having slots therein vertically aligned with the grooves in said base plate, each of said slots being proportioned to engage a semiconductor disc at least as high as its center of gravity when the disc is positioned standing on end in one of said grooves, each of said discs being supported with substantially edge contact in its groove and slot.

2. The device of claim 1 in which both said base plate and said holder are composed of silicon.

3. The device of claim 1 in which both said base plate and said holder are composed of a Group 3-Group 5 compound.

4. The device of claim 1 in which both said base plate and said holder are composed of a Group 2-Group 6 compound.

5. The device of claim 1 in which both said base plate and said holder are composed of boron nitride.

6. The device of claim 1 in which both said base plate and said holder are composed of silicon carbide.

* * * * *